(12) United States Patent
Kim

(10) Patent No.: US 7,273,564 B2
(45) Date of Patent: Sep. 25, 2007

(54) METHOD AND APPARATUS FOR FABRICATING FLAT PANEL DISPLAY

(75) Inventor: Jin Wuk Kim, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 127 days.

(21) Appl. No.: 10/963,550

(22) Filed: Oct. 14, 2004

(65) Prior Publication Data
US 2005/0139576 A1    Jun. 30, 2005

(30) Foreign Application Priority Data
Dec. 27, 2003   (KR) .............................. 2003-98122

(51) Int. Cl.
*C30B 33/00* (2006.01)
(52) U.S. Cl. .................... 216/23; 216/42; 216/43; 216/54
(58) Field of Classification Search ............ 216/23, 216/42, 43, 54
See application file for complete search history.

(56) References Cited

U.S. PATENT DOCUMENTS

| | | | | |
|---|---|---|---|---|
| 5,259,926 A | | 11/1993 | Kuwabara et al. ....... 156/659.1 |
| 6,020,047 A | * | 2/2000 | Everhart ..................... 428/209 |
| 6,190,929 B1 | * | 2/2001 | Wang et al. .................. 438/20 |
| 6,309,580 B1 | * | 10/2001 | Chou .......................... 264/338 |
| 6,921,615 B2 | * | 7/2005 | Sreenivasan et al. ......... 430/22 |
| 6,964,793 B2 | * | 11/2005 | Willson et al. ............. 427/466 |
| 2002/0127499 A1 | | 9/2002 | Endo et al. ................. 430/327 |
| 2005/0082700 A1 | * | 4/2005 | Deeman et al. .............. 264/2.5 |

FOREIGN PATENT DOCUMENTS

| | | |
|---|---|---|
| JP | 05-080530 | 4/1993 |
| JP | 10-221522 | 8/1998 |
| JP | 2002-270541 | 9/2002 |

\* cited by examiner

*Primary Examiner*—Binh X. Tran
(74) *Attorney, Agent, or Firm*—Morgan, Lewis & Bockius LLP

(57) ABSTRACT

A method of fabricating a flat panel display device including: coating an etch-resist on a thin film; forming a soft mold having a groove and a protrusion for patterning the thin film; treating an end surface of the protrusion; applying the soft mold to the etch-resist to form an etch-resist pattern; separating the soft mold from the etch-resist pattern; and etching the thin film by using the etch-resist pattern to form a thin film pattern.

12 Claims, 7 Drawing Sheets

METHOD AND APPARATUS FOR FABRICATING FLAT PANEL DISPLAY

This application claims the benefit of Korean Patent Application No. P2003-98122 filed in Korea on Dec. 27, 2003, which is hereby incorporated by reference.

BACKGROUND OF THE INVENTION

1. Field of the Invention

The present invention relates to a flat panel display device, more particularly, to a method and apparatus for fabricating a flat panel display device.

2. Description of the Related Art

In recent years, the importance of display devices in presenting visual information has increased. In the past, a cathode ray tube was widely used. However, a cathode ray tube is heavy, large and has a bulky profile.

A liquid crystal display (LCD) device, a field emission display (FED) device, a plasma display panel (PDP) and an electro-luminescence (EL) device are flat panel display devices available in the market having a thin profile. The liquid crystal display device is light and its mass production yield is steadily improving. Thus, the liquid crystal display has been rapidly replacing the cathode ray tube in many fields.

A liquid crystal display device of active matrix type, which drives liquid crystal cells by using thin film transistors (hereinafter "TFT"), has excellent picture quality and low power consumption. The active matrix type liquid crystal display device is quickly being developed to have a larger size and higher resolution. Further, mass production technology is increasing the production yield of such a liquid crystal display.

Referring to FIG. 1, the liquid crystal display device of the active matrix type includes a color filter array substrate 22 and a TFT array substrate 23. A polarizing plate 17 is attached on the bottom surface of the TFT array substrate 23. A liquid crystal layer 15 is positioned between the color filter array substrate 22 and the TFT array substrate 23. The liquid crystal display device shown in FIG. 1 represents only a portion of an active matrix type liquid crystal display device. In the color filter array substrate 22, a color filter 13 and a common electrode 14 are formed on the bottom surface of an upper glass substrate 12. A polarizing plate 11 is attached on the top surface of the upper glass substrate 12. The color filter 13 includes color filter layers of red R, green G and blue B colors that transmit lights of particular wavelength bandwidth to display colors corresponding thereto, respectively. A black matrix (not shown) is formed between the color filters 13 adjacent with each other.

In the TFT array substrate 23, data lines 19 and gate lines 18 cross each other. TFTs 20 are respectively formed at the crossings of the data lines 19 and the gate lines 18. In addition a pixel electrode 21 is formed at a cell region defined between the data lines 19 and the gate lines 18. The liquid crystal layer 15 controls an amount of light to be transmitted through the TFT array substrate 23 in accordance with the amount of electric field applied across the liquid crystal layer 15. The polarizing plates 11 and 17 transmit light polarized in one direction, and their polarizing directions cross each other. Light is transmitted through the polarizing plates 11 and 17 via the liquid crystal layer 15 when the liquid crystal 15 is in the 90° TN mode. An alignment film (not shown) is formed on the opposite surfaces of the color filter array substrate 22 and the array TFT substrate 23.

The fabricating process for producing the liquid crystal display of active matrix type includes a substrate cleaning process, a substrate patterning process, an alignment forming/rubbing process, a substrate bonding/liquid crystal injection process, a mounting process, an inspection process, a repair process and the like. The substrate cleaning process removes impurities contaminating the substrate surface of the liquid crystal display. The substrate patterning process is subdivided into the patterning process of the color filter substrate and the patterning process of the TFT array substrate. The alignment film forming/rubbing process coats an alignment film onto each of the color filter substrate and the TFT array substrate and rubs the alignment film with a rubbing wheel. The substrate bonding/liquid crystal injection process bonds the color filter substrate with the TFT array substrate through the use of a sealant and injects liquid crystal and spacers through a liquid crystal injection hole, and then seals the liquid crystal injection hole. The mounting process connects a tape carrier package (TCP) to a pad part of the substrate. The TCP has integrated circuits, such as a gate drive IC and a data drive IC. The drive integrated circuit may also be directly mounted on the substrate by a chip-on-glass (COG) technique in addition to a tape automated bonding (TAB) technique using the TCP. The inspection process includes an electrical inspection conducted after forming signal lines, such as data lines, gate lines and the pixel electrodes on the TFT array substrate, and an additional electrical inspection and a naked-eye inspection conducted after performing the substrate bonding/liquid crystal injection process. The repair process conducts a restoration of a substrate judged to be repairable through the inspection process. The substrate that is judged to be un-repairable through the inspection process is discarded.

In the fabricating method of the flat panel display devices including the liquid crystal display device, a thin film material deposited on the substrate is patterned by a photolithography process. In general, the photolithography process includes a series of photo-processes including a photo-resist coating, a mask alignment, an exposure, a development and a cleaning processes. However, there are problems in the photolithography process in that it requires a long time, wastes photo-resist material and stripping solution, and requires the use of expensive equipment, such as an exposure equipment. In addition, the problems include pattern defects.

SUMMARY OF THE INVENTION

Accordingly, the present invention is directed to a method and apparatus for fabricating a flat panel display device that substantially obviates one or more of the problems due to limitations and disadvantages of the related art.

Accordingly, it is an object of the present invention to provide a method and an apparatus of fabricating a flat panel display device capable to reduce processing times and to minimize pattern defects.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a method of fabricating a flat panel display device including: coating an etch-resist on a thin film; forming a soft mold having a groove and a protrusion for patterning the thin film; treating an end surface of the protrusion; applying the soft mold to the etch-resist to form an etch-resist pattern; separating the soft mold from the etch-resist pattern; and etching the thin film by using the etch-resist pattern to form a thin film pattern.

In another aspect, an apparatus of fabricating a flat panel display device includes: means for coating an etch-resist on a thin film; a soft mold having a groove and a protrusion for patterning the thin film, wherein an end surface of the protrusion has undergone a surface treatment process; and means for applying the soft mold to the etch-resist to form an etch-resist pattern; means for separating the soft mold from the etch-resist pattern; means for etching the thin film using the etch-resist pattern to form a thin film pattern.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings.

DETAILED DESCRIPTION OF THE PREFERRED EMBODIMENTS

Figure 1:
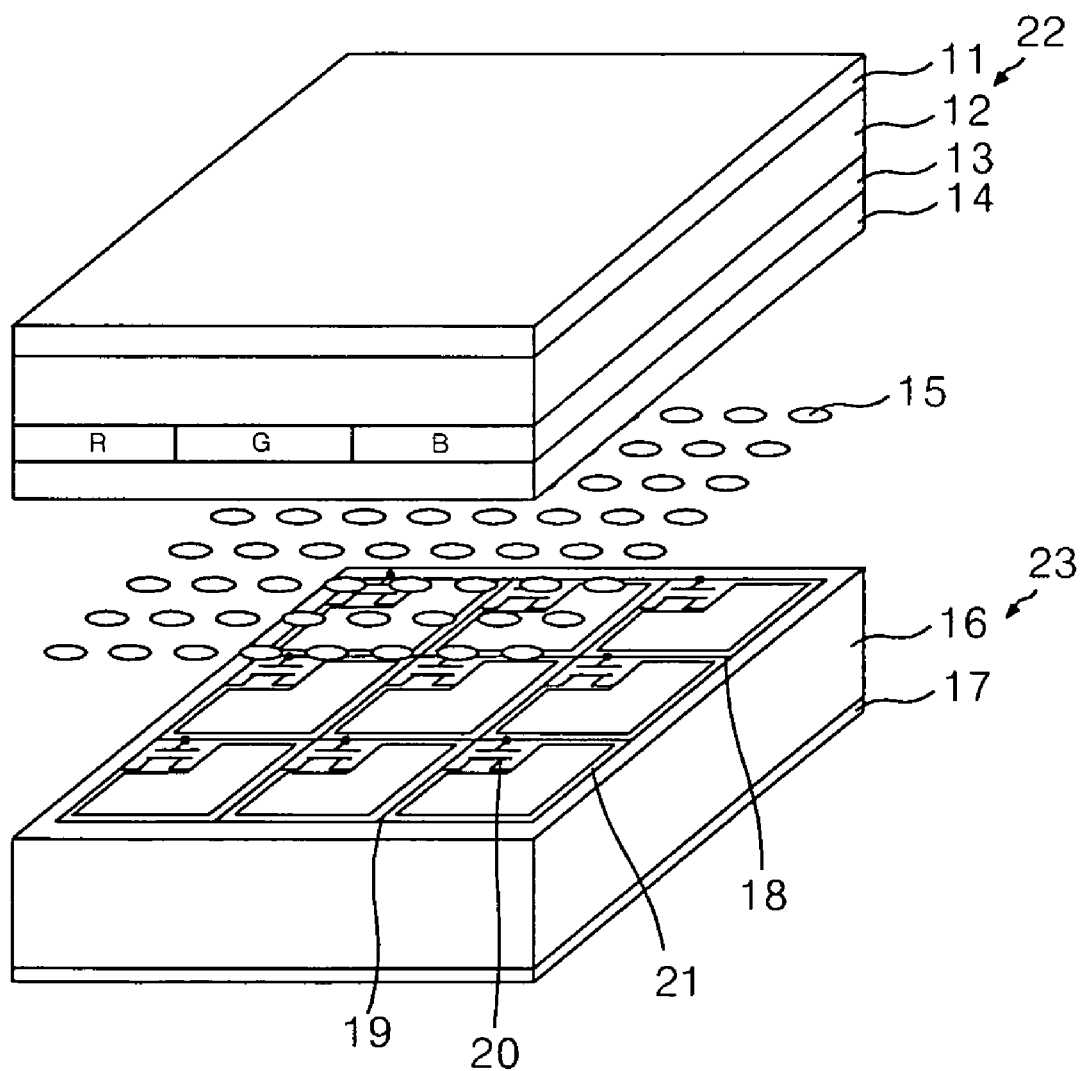
FIG. 1 is a perspective view illustrating a liquid crystal display device of an active matrix type.
Figure 2:
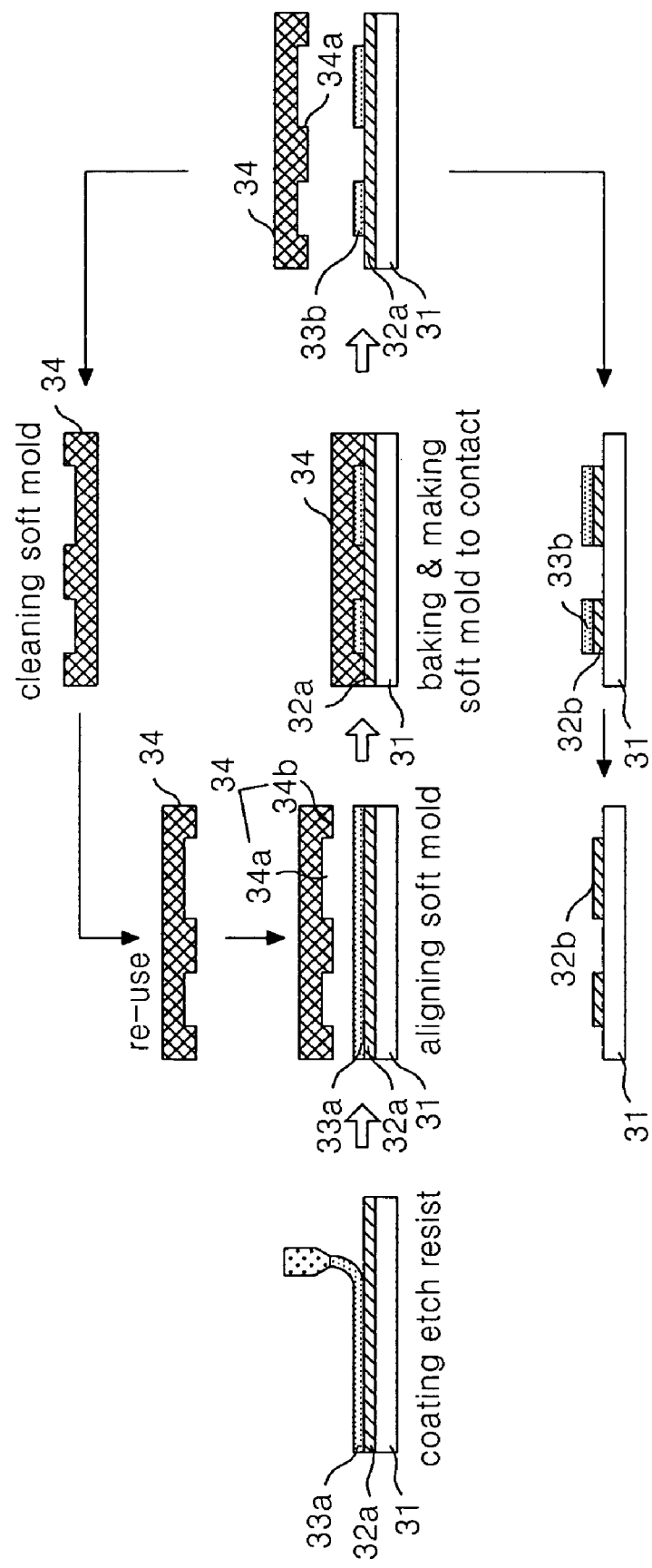
FIG. 2 is a cross-sectional view sequentially illustrating a method of fabricating a flat panel display device according to an embodiment of the present invention.

Reference will now be made in detail to the preferred embodiments of the present invention, examples of which are illustrated in the accompanying drawings. Hereinafter, the preferred embodiments of the present invention will be described in detail with reference to FIGS. 2 to 5. Referring to FIG. 2, a method of fabricating a flat panel display device according to an embodiment of the present invention includes an etch-resist coating process in which an etch-resist solution 33a is coated over a glass substrate 31 having a thin film 32a formed thereon, a patterning process of the etch-resist solution 33a using a soft mold 34, an etching process for patterning the thin film 32a and a stripping process for removing a remainder of the etch-resist pattern; and an inspection process. The thin film 32a formed on the glass substrate 31 is a typical material used in a pixel array of the flat panel display device, such as a metal pattern, an organic pattern and an inorganic pattern, formed on the glass substrate 31 by a coating process or deposition process. The etch resist solution 33a has characteristics of heat-resistance and a chemical-resistance, for example, a solution in which novolac resin of about 5 weight % to 30 weight % is added in an ethanol solution. The etch-resist solution 33a is coated on the thin film 32a by a coating process, such as a nozzle spray and a spin coating.

Figure 3:
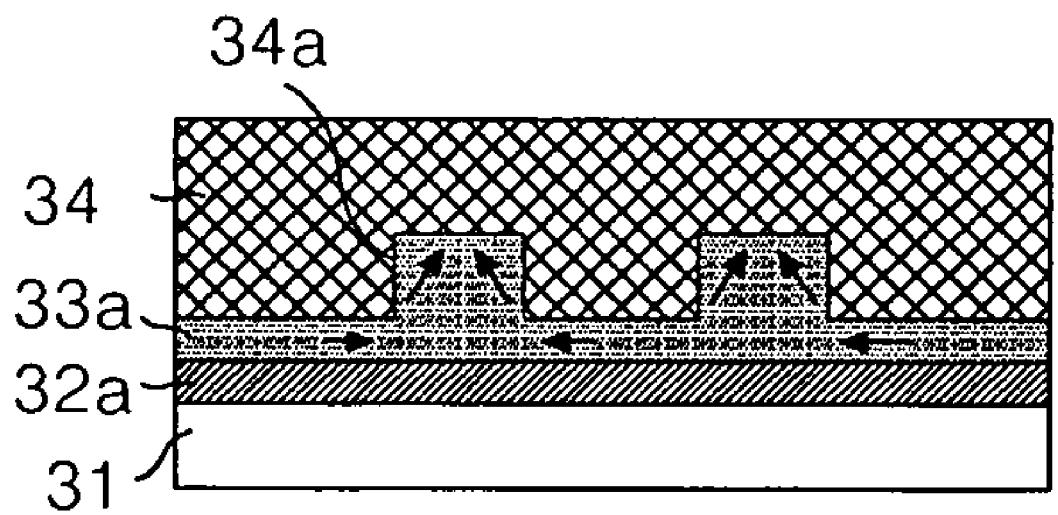
FIG. 3 is a cross-sectional view illustrating a movement of an etch resist solution when the soft mold shown in FIG. 2 is in contact with the substrate.

The soft mold 34 is made of a rubber material with a high elasticity, for example, polydimethylsiloxane (PDMS), polyurethane and cross-linked novolac resin. The soft mold 34 has a groove 34a formed therein corresponding to a desired pattern that is to remain on the glass substrate 31 and a protrusion 34b. The soft mold 34 is aligned on the etch-resist solution 33a, and then is applied to the etch-resist solution 33a. For example, the soft mold 34 applies pressure to the thin film 32a by its own weight. At the same time, the glass substrate 31 is baked for about 10 minutes to 2 hours at a temperature of about less than 130° C. The etch-resist solution 33a moves into the groove 34A of the soft mold 34, as shown in FIG. 3, by the capillary force exerted by pressure between the soft mold 34 and the glass substrate 31 and by the repulsive force exerted between the soft mold 34 and the etch-resist solution 33a. As a result, the etch-resist pattern 33b is formed on the thin film 32a as a reversely transferred pattern.

Thereafter the soft mold 34 is separated from the glass substrate 31, and then an etching process using a wet etching device or a dry etching device is carried out. At this moment, the etch-resist pattern 33b acts as a mask. Thus, only the portion of the thin film 32a located under the etch-resist pattern 33b is left on the glass substrate 31 and the other portion of the thin film 32a is removed. Subsequently, the etch-resist pattern 33b is removed by a stripping process. The thin film pattern 32b is judged to be shorted or opened through an electrical and optical inspection of the thin film pattern 32b.

The soft mold 34, after being separated from the glass substrate 31, is cleaned with ultra violet UV ray and ozone ($O_3$), and then re-used for the patterning process of another thin film 32a.

Figure 4A:
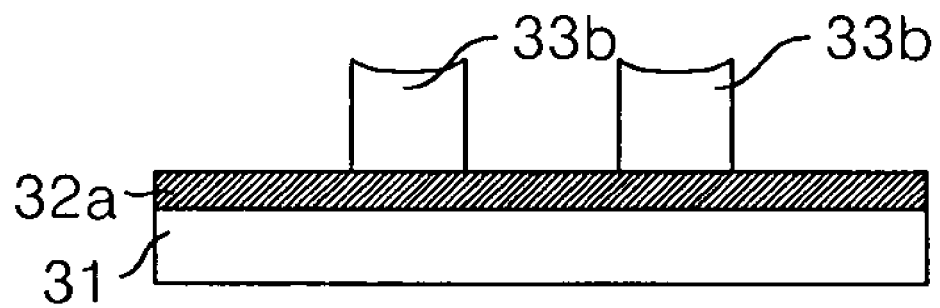
FIGS. 4A to 4C are cross-sectional views schematically showing various types of an etch resist pattern.
Figure 4B:
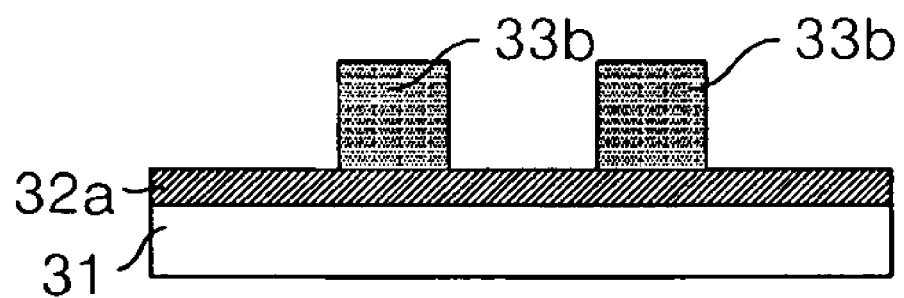
Figure 4C:
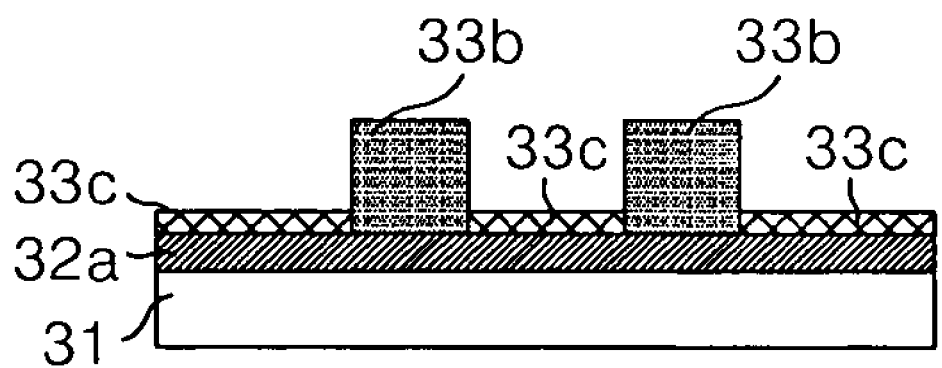

FIGS. 4A to 4C are cross-sectional views schematically showing various types of etch resist patterns. In the patterning process of the etch-resist material, however, an undesired residual film may remain along with the etch-resist pattern 33b on the thin film 32a. In this case, there occurs a pattern defect in the thin film 32a. For instance, if the capillary force and the repulsive force exerted between the soft mold 34 and the etch-resist solution 33a become strong, then the movement of the etch-resist solution 33a becomes smooth, which results in that, as shown in FIGS. 4A and 4B, the etch-resist pattern 33b is formed into a desired shape. On the contrary, if the repulsive force between the soft mold 34 and the etch-resist solution 33a becomes weak, then the movement of the etch-resist solution 33a is not smooth. Accordingly, as shown in FIG. 4C, an undesired residual film 33c is formed in addition to the etch-resist solution 33a is left on the thin film 32a.

According to the method of fabricating the flat panel display device in embodiments of the present invention, a surface of the soft mold 34 opposite to the etch-resist material is made to have a high repulsive force against the etch-resist solution 33a by performing a surface treatment process on the soft mold 34. The surface treatment process makes the repulsive force between the soft mold 34 and the etch-resist solution 33a high such that the etch-resist solution 33a is smoothly moved in the groove 34a of the soft mold 34 when the soft mold 34 is applied to the etch-resist solution 33a.

Figure 5:
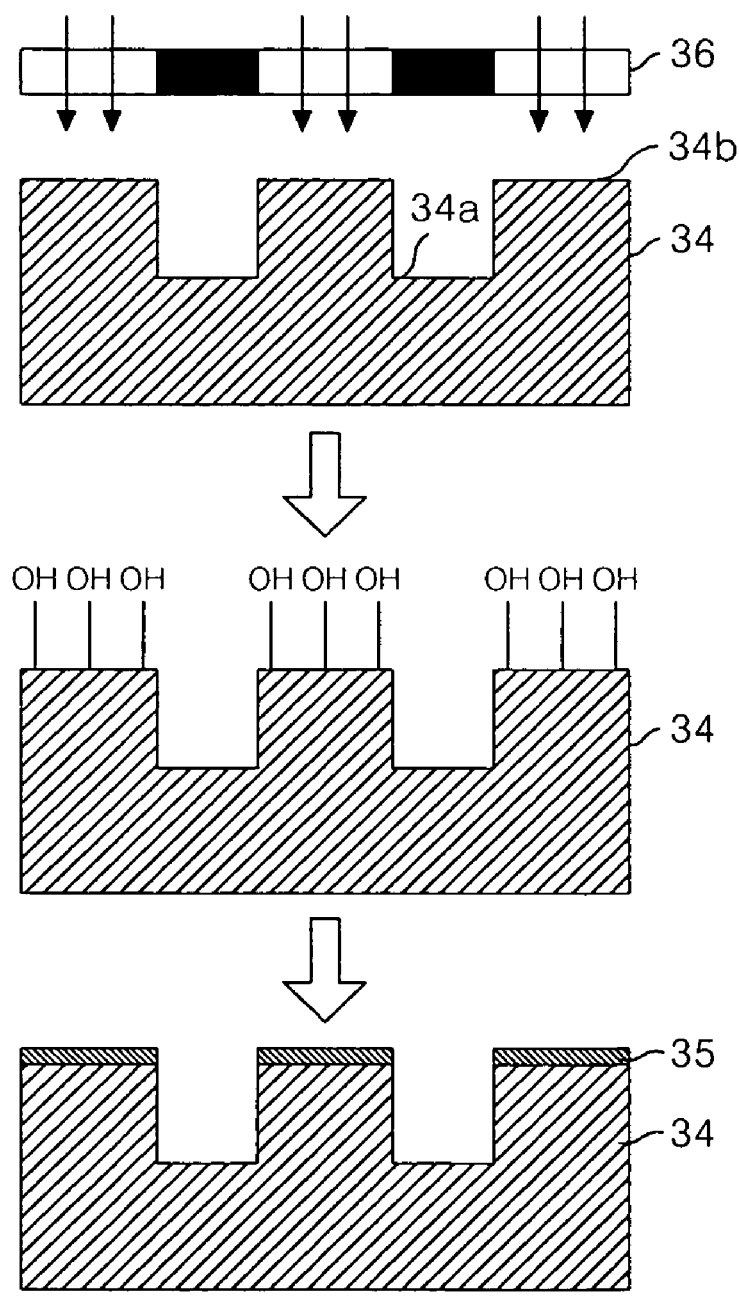
FIG. 5 is a cross-sectional view showing a surface treatment process using the soft mold shown in FIG. 2.

FIG. 5 shows a sequential surface treatment processing using the soft mold 34 according to an embodiment of the present invention. As shown in FIG. 5, a photo mask 36 is aligned on the surface of the soft mold 34b that will be opposite to an etch-resist. As described above, the soft mold 34 includes a rubber material with a high elasticity, for example, polydimethylsiloxane (PDMS), polyurethane and cross-linked novolac resin, in which a groove 34a and a protrusion 34b are formed on the surface of the soft mold 34b that will be opposite to the etch-resist. When the end surface of the protrusion 34b of the soft mold 34 is contacted with the thin film 32a, the etch-resist solution 33a moves to fill in the groove 34a. The photo mask 36 has a light transmitting part exposing to light only the end surface of the protrusion 34b of the soft mold 34. In a state that the photo mask 36 is aligned, an ultraviolet ray is irradiated onto the end surface of the protrusion 34b of the soft mold 34. The ultraviolet ray has a wavelength of 180 nm to 300 nm. Then, radical $CH_3$ is vaporized from the end surface of the protrusion 34b of the soft mold 34 and then the phase of the end surface 34b of the protrusion is converted into a silicon oxide (SiOx) layer. If ozone ($O_3$) is supplied during such an exposure process, the end surface of the protrusion 34b temporarily has a hydrophilic property (for about 2 hours) even though the soft mold 34 is an ultra-hydrophobic material.

Subsequently, a process is performed to react a self assembly materials (SAM) of a vapor state or a liquid state to the end surface of the protrusion 34b of the soft mold 34 converted into the silicon oxide layer. The SAM makes the end surface of the protrusion 34b to be an ultra-hydrophobic or an ultra-hydrophilic. One example of the SAM includes silyl chloride vapor having the following chemical formula 1.

  formula 1

In formula 1, R represents an alkyl group, and X represents a terminal group. The end surface of the protrusion 34b in the soft mold 34 becomes ultra-hydrophobic or ultra-hydrophilic in accordance with the terminal group X. For instance, when the terminal group X is a chemical element of an alkyl radical —Cl, —F, —I or —$CH_3$, the surface of the protrusion 34b permanently has the ultra-hydrophobic property. On the contrary, when the terminal group X is a chemical element of a carboxyl radical —OH, —COOH or —COH, the end surface of the protrusion 34b permanently has a ultra-hydrophilic property.

A repulsion layer 35 which has been ultra-hydrophobic or ultra-hydrophilic on the end surface of the protrusion 34b is made to have a high repulsive force against the etch-resist material. If the etch-resist solution 33a has a hydrophilic property, then the repulsion layer 35 should have hydrophobic, on the other hand, if the etch-resist solution 33a has a hydrophobic property, the repulsion layer 35 should be hydrophilic. The repulsion layer 35 has a thickness of about several tens of angstroms (Å).

The method and the apparatus of fabricating the flat panel display device according to embodiments of the present invention is applicable to a process for patterning an electrode layer, an organic layer and inorganic layer of a flat panel display devices, such as a liquid crystal display (LCD) device, a field emission display (FED) device, a plasma display panel (PDP) and an electro-luminescence (EL) device.

As described above, the method and the apparatus of fabricating the flat panel display device according to embodiments of the present invention is capable of patterning the thin film of the flat panel display device without employing the photo process through the use of the soft mold and an etch-resist, thereby reducing its process time, and making the repulsive force between the soft mold and the etch-resist through the surface process of the soft mold to be large, which enables the minimization of pattern defects.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a flat panel display device comprising:
   coating an etch-resist on a thin film;
   forming a soft mold having a groove and a protrusion for patterning the thin film;
   treating only an end surface of the protrusion;
   applying the soft mold to the etch-resist to form an etch-resist pattern such that substantially all of the etch-resist moves into the groove of the soft mold upon applying the soft mold to the etch-resist;
   separating the soft mold from the etch-resist pattern; and
   etching the thin film by using the etch-resist pattern to form a thin film pattern.

2. The method according to claim 1, wherein the flat panel display device includes any one of a liquid crystal display (LCD) device, a field emission display (FED) device, a plasma display panel (PDP) and an electro-luminescence (EL) device.

3. The method according to claim 1, further comprising baking the etch-resist while applying the soft mold to the etch-resist to form the etch-resist pattern.

4. The method according to claim 1, further comprising stripping the etch-resist pattern after etching the thin film pattern.

5. The method according to claim 1, wherein treating the end surface makes a repulsion layer on the end surface having a repulsive force against the etch-resist.

6. The method according to claim 1, wherein forming a soft mold includes using one of polydimethylsiloxane (PDMS), polyurethane and cross-linked novolac resin.

7. The method according to claim 1, further comprising:
   cleaning the soft mold with ultra violet UV ray and ozone ($O_3$); and
   reusing the soft mold for the patterning process of another thin film.

8. The method according to claim 1, wherein treating the end surface of the protrusion provides a hydrophilic or hydrophobic property.

9. The method according to claim 1, wherein treating the soft mold includes:
   exposing the end surface of the protrusion to light;
   supplying ozone $O_3$ to the end surface of the protrusion that is exposed to the light; and
   exposing the end surface of the protrusion supplied with the ozone to a self assembly material.

10. The method according to claim 9, wherein the end surface of the protrusion is one of a hydrophilic property and a hydrophobic property in accordance with a terminal group of the self assembly material.

11. The method according to claim 10, wherein the terminal group includes at least one of —OH, —COOH and —COH and the end surface of the protrusion surface is a hydrophilic property.

12. The method according to claim 10, wherein the end surface of the protrusion surface has a hydrophobic property and the terminal group includes at least one of —Cl, —F, —I and —$CH_3$.

* * * * *